United States Patent
Hong (10) Patent No.: US 9,147,811 B2
(45) Date of Patent: Sep. 29, 2015

(54) LIGHT EMITTING DEVICE AND LIGHTING SYSTEM

(71) Applicant: LG INNOTEK CO., LTD, Seoul (KR)

(72) Inventor: Ki Yong Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/307,038

(22) Filed: Jun. 17, 2014

(65) Prior Publication Data

US 2014/0367715 A1    Dec. 18, 2014

(30) Foreign Application Priority Data

Jun. 18, 2013  (KR) .................. 10-2013-0069663

(51) Int. Cl.
- *H01L 33/44* (2010.01)
- *H01L 33/30* (2010.01)
- *H01L 33/10* (2010.01)
- *H01L 33/02* (2010.01)

(52) U.S. Cl.
CPC .............. *H01L 33/44* (2013.01); *H01L 33/025* (2013.01); *H01L 33/10* (2013.01); *H01L 33/30* (2013.01)

(58) Field of Classification Search
USPC ........................................ 257/82, 88, 79, 290
See application file for complete search history.

(56) References Cited

U.S. PATENT DOCUMENTS

| | | | |
|---|---|---|---|
| 2006/0163603 A1 | 7/2006 | Takeuchi et al. | 257/103 |
| 2007/0023768 A1 | 2/2007 | Konno et al. | 257/86 |
| 2009/0140273 A1 | 6/2009 | Takeuchi et al. | 257/94 |
| 2011/0133155 A1* | 6/2011 | Yoon et al. | 257/13 |
| 2011/0156068 A1* | 6/2011 | Kwon et al. | 257/94 |
| 2011/0175120 A1* | 7/2011 | Yoon et al. | 257/94 |
| 2011/0198634 A1* | 8/2011 | Sasaki et al. | 257/94 |
| 2013/0270520 A1* | 10/2013 | Ishizaki | 257/13 |

FOREIGN PATENT DOCUMENTS

KR    10-2012-0103817    9/2012

OTHER PUBLICATIONS

European Search Report dated Nov. 11, 2014 issued in Application No. 14 172 841.0.

* cited by examiner

*Primary Examiner* — Thao P Le (74) *Attorney, Agent, or Firm* — Ked & Associates, LLP

(57) ABSTRACT

Disclosed are a light emitting device, a method of fabricating the light emitting device, a light emitting device package, and a lighting system. The light emitting device includes a first conductive semiconductor layer (130), an AlGaInP-based active layer (140) on the first conductive semiconductor layer (130), a second conductive clad layer (150) on the AlGaInP-based active layer (140), a second conductive GaP layer (162) having first concentration on the second conductive clad layer (150), and a second conductive GaP layer (164) having second concentration higher than the first concentration on the second conductive GaP layer (162) having the first concentration.

17 Claims, 7 Drawing Sheets

LIGHT EMITTING DEVICE AND LIGHTING SYSTEM

CROSS-REFERENCE TO RELATED APPLICATION

This application claims priority under 35 U.S.C. §119 to Korean Patent Application No. 10-2013-0069663 filed on Jun. 18, 2013, whose entire disclosure is hereby incorporated by reference.

BACKGROUND

1. Field

The embodiment relates to a light emitting device, a method of fabricating the light emitting device, a light emitting device package, and a lighting system.

2. Background

A light emitting device includes a P-N junction diode having a characteristic of converting electrical energy into light energy. The light emitting device may include compound semiconductors belonging to group III and V on the periodic table. The light emitting device can represent various colors by adjusting the compositional ratio of the compound semiconductors.

When forward voltage is applied to the LED, electrons of an N layer are combined with holes of a P layer, so that energy corresponding to an energy gap between a conduction band and a valance band may be generated. The energy is mainly emitted in the form of heat or light. In the case of the LED, the energy is generated in the form of light.

For example, a nitride semiconductor represents superior thermal stability and wide bandgap energy so that the nitride semiconductor has been spotlighted in the field of optical devices and high-power electronic devices. In particular, blue, green, and UV light emitting devices employing the nitride semiconductor have already been commercialized and extensively used.

Among light emitting diodes having a visible ray region, a light emitting diode (red LED) having a wavelength representing high utilization is a red element, which represents a superior visibility in the same brightness as compared with green and yellow elements. Accordingly, the red element has been extensively used for various fields such as traffic lights, stop lamps of vehicles, and various displays.

Meanwhile, in the case of a red LED according to the related art, since low power is required, low current is applied, so that magnesium (Mg) diffusion issues may not be important. However, recently, as the demand for a high-power red LED chip is increased, high current is applied, so that the Mg diffusion issue into the active region has been spotlighted, and Mg existing in a GaP window layer is diffused in an active region when a reliability test is performed, so that light output power drip (Po drop) may occur.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
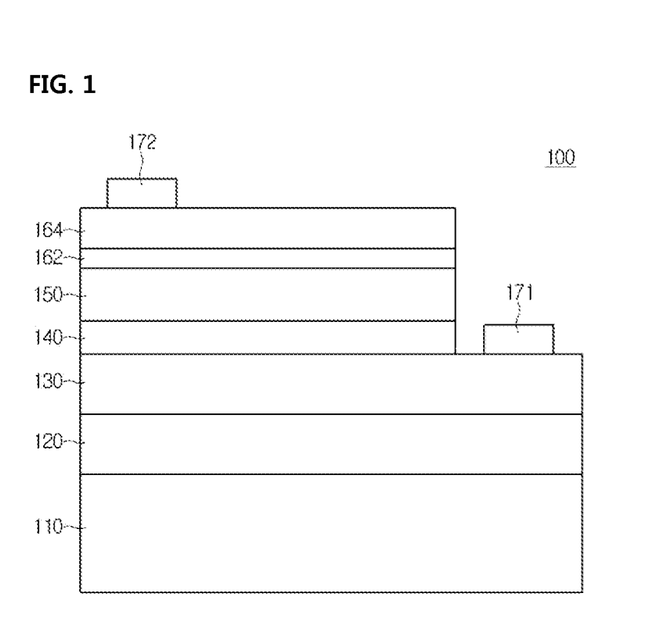
FIG. 1 is a sectional view showing a light emitting device according to a first embodiment.
Figure 2:
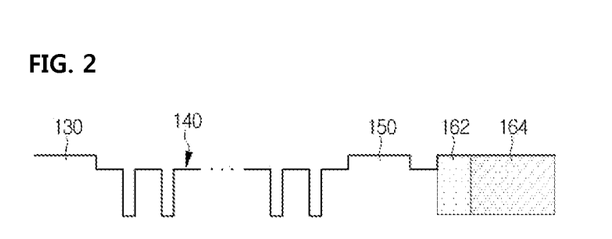
FIG. 2 is a bandgap energy diagram of the light emitting device according to the first embodiment.

FIG. 1 is a sectional view showing a light emitting device 100 according to a first embodiment, and FIG. 2 is a bandgap energy diagram of the light emitting device according to the first embodiment.

The light emitting device 100 according to the embodiment may include a first conductive semiconductor layer 130, an AlGaInP-based active layer 140 on the first conductive semiconductor layer 130, a second conductive clad layer 150 on the AlGaInP-based active layer 140, a second conductive GaP layer 162 having first concentration on the second conductive clad layer 150, and a second conductive GaP layer 164 having second concentration on the second conductive GaP layer 162.

Figure 3:
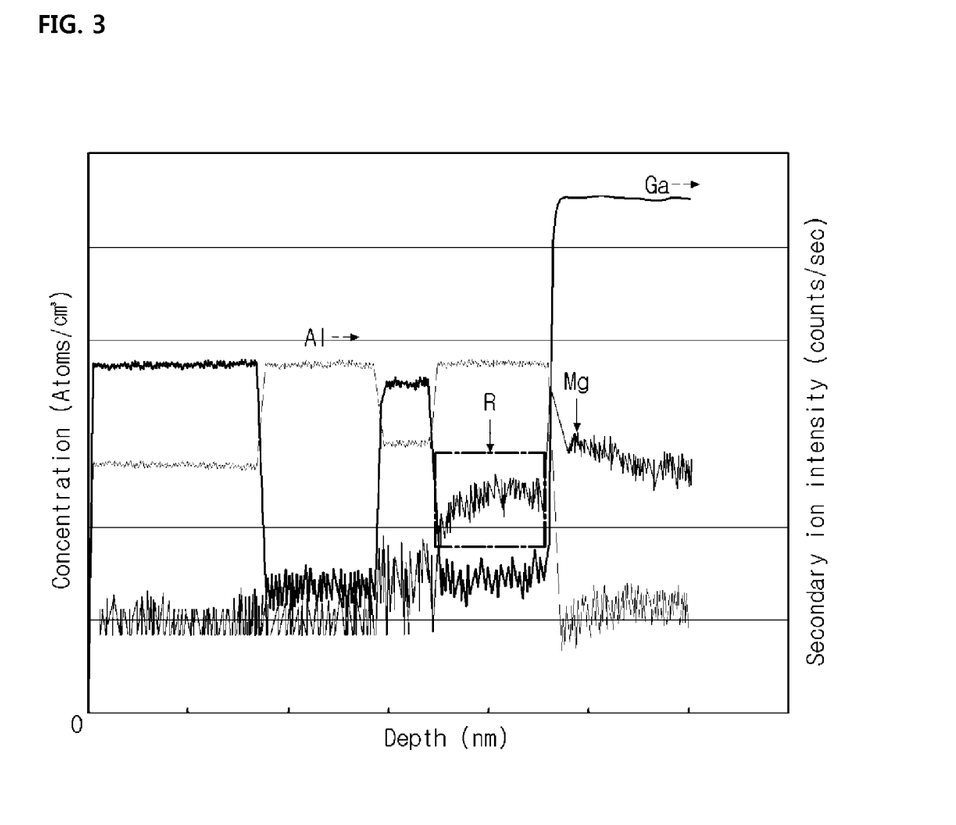
FIG. 3 is a graph showing SIMS analysis data of a light emitting device according to the comparative example.
Figure 4:
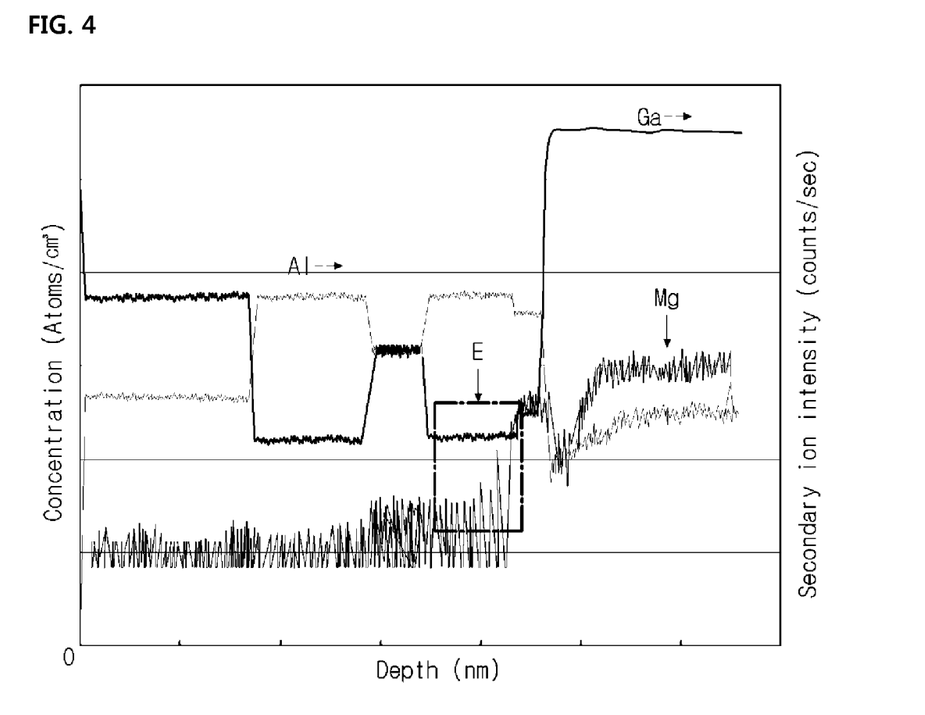
FIG. 4 is a graph showing SIMS analysis data of a light emitting device according to the embodiment.

FIG. 3 is a graph showing secondary ion mass spectrometry (SIMS) analysis data of a light emitting device according to a comparative example, and FIG. 4 is a view showing SIMS analysis data of the light emitting device according to the embodiment.

Figure 5:
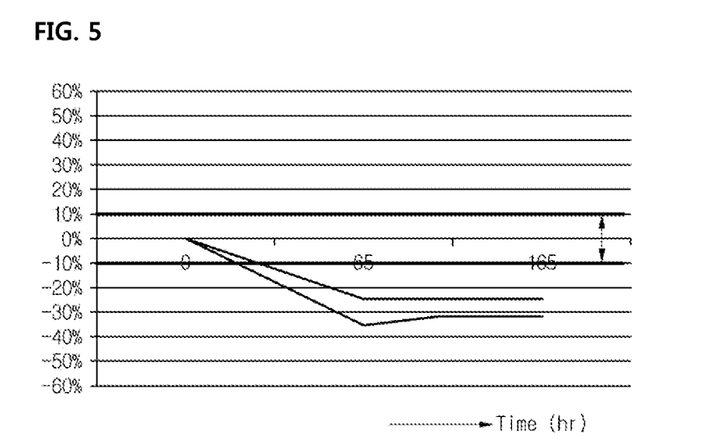
FIGS. 5 and 6 are graphs showing reliability measurement data of the light emitting device according to the comparative example and the embodiment.
Figure 6:
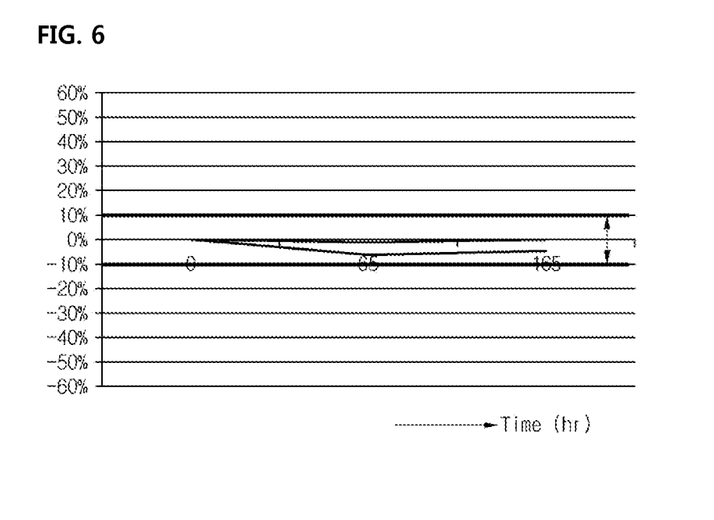

FIGS. 5 and 6 are graphs showing reliability measurement data of the light emitting device according to the comparative example and the embodiment.

In detail, FIG. 5 is a graph showing light output power (Po) variation data of the light emitting device according to the comparative example, and FIG. 6 is a graph showing Po variation data of the light emitting device according to the embodiment.

FIGS. 5 and 6 are graphs showing reliability test results for two samples subject to a reliability test according to the comparative example and the embodiment.

As described above, since a red LED according to the related art requires low power, low current is applied, so that the Mg diffusion issue is not important. However, recently, as the demand for a high-power red LED chip is increased, high current is applied, so that the Mg diffusion issue into the active region has been spotlighted.

For example, generally, an AlGaInP Red LED employs a GaP window layer, and Mg is heavily doped into the GaP window layer.

Therefore, when the reliability test is performed, Mg existing in the GaP window layer is diffused into the active region, so that Po drop may occur.

In detail, according to the related art, when Mg is doped into the GaP layer, Mg is doped into the entire portion of the GaP layer at a predetermined level. The doping profile causes Mg diffusion into the active layer as current is applied in the LED operating/life time test (see part R).

For example, as shown in FIG. 3, the Mg diffusion (part R) occurs, so that Mg profile may be adjacent to an active region on the SIMS.

Therefore, as shown in FIG. 5, when the reliability test is performed, as the operating/life time test is performed, Mg is infiltrated into the active region, so that the light output power (Po) is dropped, thereby causing the reliability problem.

In other words, in terms of the light output power (Po), as 65 hours or 165 hours are elapsed, the light output power (Po) may be out of the range of ±10% when comparing with that of the initial stage of the reliability test.

Meanwhile, in order to compensate for the above light output power, the second conductive GaP layer 162 having the first concentration and the second conductive GaP layer 164 having the second concentration higher than the first concentration may be provided on the second conductive clad layer 150.

In other words, according to the embodiment, the second conductive GaP layer 162 having the first concentration, which is lower concentration, is grown before the second conductive GaP layer 164 having the second concentration to trap diffused Mg.

In detail, according to the embodiment, Mg is trapped in the second conductive GaP layer 162 having the first concentration as shown in a part E of FIG. 4 to prevent Mg diffusion, so that an Mg free region is formed.

In addition, therefore, as shown in FIG. 6, when the reliability test is performed, that is, when the LED operation/life time test is performed, the stable Po characteristic is ensured, so that the high reliability can be obtained.

In other words, in terms of the Po, as 65 hours or 165 hours are elapsed, the Po may be in the range of ±10% when comparing with that of the initial stage (0 hr) of the reliability test, which represents a stable result.

According to the embodiment, the concentration of the second conductive GaP layer 162 may be about 10% to about 30% based on the concentration of the second conductive GaP layer 164.

For example, the second conductive GaP layer 164 having the second concentration may have Mg doping concentration of about $1 \times 10^{17}$ atoms/cm3 to $9 \times 10^{17}$ atoms/cm3, and the concentration of the second conductive GaP layer 162 may be about 10% to about 30% based on the Mg doping concentration of the second conductive GaP layer 164, but the embodiment is not limited thereto.

If the first concentration exceeds 30% based on the second concentration, the function of Mg trap may not be difficult. If the first concentration is less than 10% based on the second concentration, the hole injection may be failed.

FIGS. 4 and 6 show results when the first concentration is in the range of 10% to 30% based on the second concentration. When the first concentration is in the range of 10% to 30% based on the second concentration, a light emitting device, which can prevent the Po drop when the reliability evaluation of the AlGaInP-based LED is performed, can be provided.

In addition, according to the embodiment, the thickness of the second conductive GaP layer 162 having the first concentration may be about 1% to about 10% based on the thickness of the second conductive GaP layer 164 having the second concentration.

For example, the thickness of the second conductive GaP layer 164 having the second concentration may be in the range of about 3 µm to 4.5 µm, and the thickness of the second conductive semiconductor layer 162 having the first concentration may be in the range of about 1% to 10% based on the thickness of the second conductive GaP layer 164.

If the thickness of the second conductive semiconductor layer 162 having the first concentration exceeds 10% based on the thickness of the second conductive semiconductor layer 164 having the second concentration, the second conductive semiconductor layer 162 having the first concentration may serve as a hole injection barrier. If the thickness of the second conductive semiconductor layer 162 having the first concentration is less than 1% based on the thickness of the second conductive semiconductor layer 164 having the second concentration, a function of preventing the Mg diffusion may be difficult.

According to the embodiment, the second conductive GaP layer 162 having the first concentration and the second conductive GaP layer 164 having the second concentration higher than the first concentration are provided on the second conductive clad layer 150, so that the second conductive GaP layer 162 having the first concentration prevents Mg diffusion. Accordingly, a light emitting device capable of preventing the Po drop when the reliability evaluation of the AlGaInP-based LED is performed, a method of fabricating the light emitting device, a light emitting device package, and a lighting system can be provided.

Figure 7:
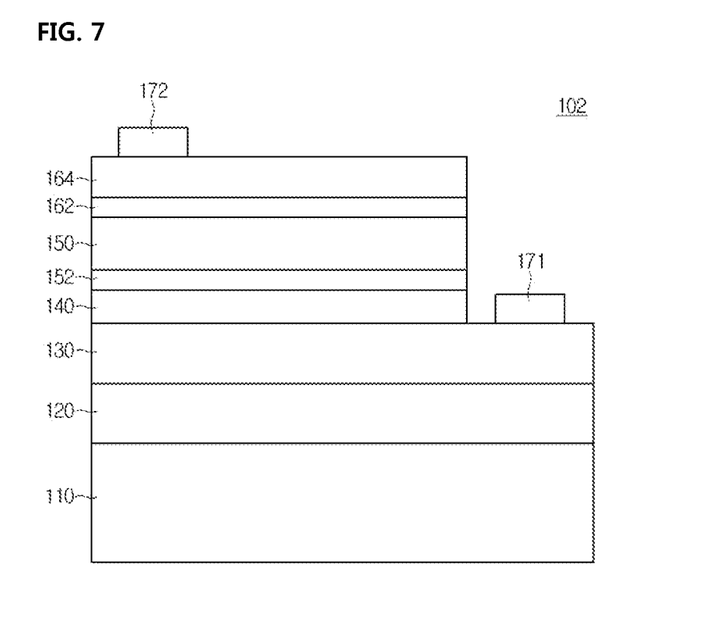
FIG. 7 is a sectional view showing a light emitting device according to a second embodiment.
Figure 8:
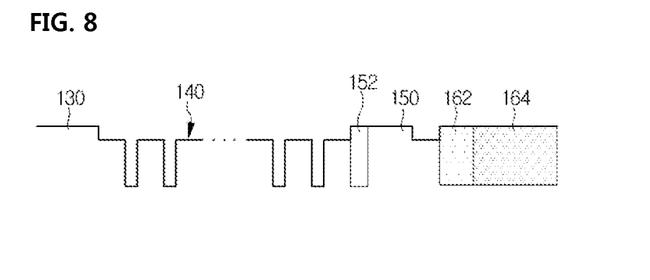
FIG. 8 is a bandgap energy diagram of the light emitting device according to the second embodiment.

FIG. 7 is a sectional view showing a light emitting device 102 according to a second embodiment, and FIG. 8 is a view showing a bandgap energy diagram of the light emitting device according to the second embodiment.

The second embodiment may employ the technical feature of the first embodiment.

According to the second embodiment, an undoped AlInP-based layer 152 may be further interposed between the AlGaInP-based active layer 140 and the second conductive clad layer 150.

Therefore, a light emitting device capable of effectively preventing the Po drop by additionally preventing Mg diffusion by the undoped AlInP-based layer 152, the method of fabricating the light emitting device, a light emitting device package, and a lighting system can be provided.

According to the embodiment, the undoped AlInP-based layer 152 may have an energy level the substantially same as that of the second conductive clad layer 150.

Accordingly, the energy level of the undoped AlInP-based layer 152 is higher than the energy level of the active layer 140 to perform an electron blocking function, so that the light emission efficiency can be improved.

In addition, according to the embodiment, the undoped AlInP-based layer 152 may have a thickness thinner than that of the second conductive clad layer 150.

In addition, the thickness of the undoped AlInP-based layer 152 may be thinner than that of the second conductive GaP layer 162 having the first concentration.

Hereinafter, the method of fabricating the light emitting device according to the embodiment will be described with reference to FIGS. 9 to 10.

Figure 9:
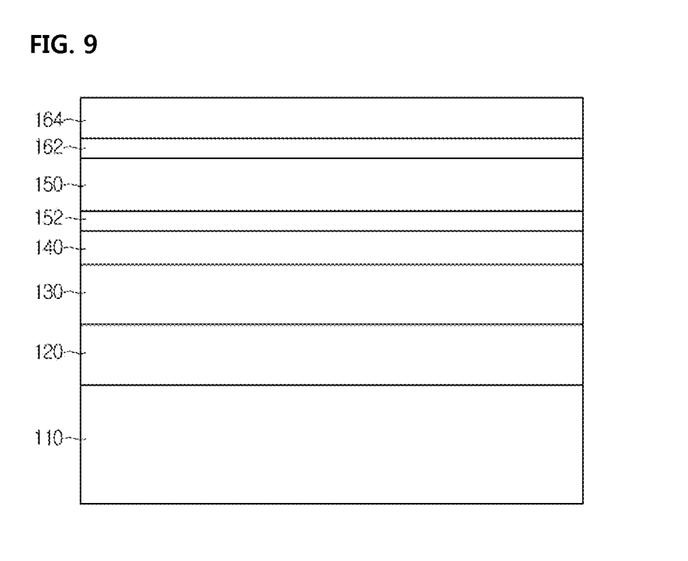
FIGS. 9 to 10 are sectional views showing a method of fabricating the light emitting device according to the embodiment.

First, as shown in FIG. 9, a substrate 110 is prepared. The substrate 110 may be a conductive substrate, but the embodiment is not limited thereto. In other words, the substrate 110 may include an insulating substrate. For example, the substrate 110 may include a GaAs substrate, but the embodiment is not limited thereto.

Therefore, according to the embodiment, a reflective layer 120 is formed on the substrate 110 to increase the light extraction efficiency.

In general, since a GaAs substrate is opaque, the GaAs substrate absorbs the light emitted from the active layer to lower the light efficiency. Accordingly, the reflective layer 120 is formed on the substrate 110, so that the light extraction efficiency can be increased.

For example, the reflective layer 120 may have a distributed bragg-reflector (DBR) mirror structure in which an AlAs/AlGaAs layer and an AlGaInP/AlInP layer are sequentially deposited at a thickness of ¼ wavelength (quarterwavelength), but the embodiment is not limited thereto.

Next, the first conductive semiconductor layer 130, the AlGaInP-based active layer 140, the undoped AlInP-based layer 152, the second conductive clad layer 150, the second conductive GaP layer 162 having the first concentration, and the second conductive GaP layer 164 having the second concentration may be sequentially formed on the reflective layer 120.

The first conductive semiconductor layer 130, which serves as an N type contact layer, may include an N type AlGaInP-based layer or an N type AlInP layer, but the embodiment is not limited thereto.

The AlGaInP-based active layer 140 represents higher light emission efficiency among red LED materials. The AlGaInP-based active layer 140 may be grown on a GaAs substrate with a compositional condition having lattice constant matching, and may be grown in the range of energy bandgap for direct transition.

The AlGaInP-based active layer 140 may be grown through a low-pressure metal-organic chemical vapor deposition (MOCVD).

According to the embodiment, the undoped AlInP-based layer 152 may be additionally interposed between the AlGaInP-based active layer 140 and the second conductive clad layer 150 to be formed in the subsequent process.

Accordingly, the light emitting device capable of effectively preventing the Po drop by preventing Mg diffusion by the undoped AlInP-based layer 152 can be provided.

According to the embodiment, the undoped AlInP-based layer 152 may have the energy level the substantially same as that of the second conductive clad layer 150.

Accordingly, the energy level of the undoped AlInP-based layer 152 is higher than the energy level of the active layer 140 so that the undoped AlInP-based layer 152 can serve as an electron blocking function, thereby improving the light emission efficiency.

In addition, according to the embodiment, the undoped AlInP-based layer 152 may have a thickness thinner than that of the second conductive clad layer 150.

In addition, the thickness of the undoped AlInP-based layer 152 may be thinner than that of the second conductive GaP layer 162 having the first concentration.

Next, according to the embodiment, the second conductive clad layer 150, the second conductive GaP layer 162 having the first concentration, and the second conductive GaP layer 164 having the second concentration may be formed on the undoped AlInP-based layer 152.

According to the embodiment, the reflective layer 120, the first conductive semiconductor layer 130, the AlGaInP-based active layer 140, the undoped AlInP-based layer 152, the second conductive clad layer 150, and the second conductive GaP layer 162 having the first concentration, and the second conductive GaP layer 164 having the second concentration may include the same material composition or similar material compositions.

When the reflective layer 120 is formed by taking into consideration the fabricating processes of the light emitting diodes through a growing scheme, the distributed bragg-reflectors rather than a metallic reflective layer are grown to have a lattice structure layer the same as that of the light emitting diode, so that a crystal can be easily grown, and the light emitting diodes have the same material composition or similar material compositions.

In other words, according to the embodiment, the second conductive GaP layer 162 having the first concentration, which is low concentration, is grown before the second conductive GaP layer 164 having the second concentration to trap diffused Mg.

In detail, according to the embodiment, Mg is trapped in the second conductive GaP layer 162 having the first concentration as shown in a part E of FIG. 4 to prevent Mg diffusion, so that an Mg free region is formed.

In addition, therefore, according to the embodiment, when the LED operation/life time test is performed, the stable Po characteristic is ensured.

According to the embodiment, the first concentration of the second conductive GaP layer 162 may be in the range of about 10% to about 30% based on the second concentration of the second conductive GaP layer 164.

For example, the second conductive GaP layer 164 having the second concentration may have Mg doping concentration of about $1 \times 10^{17}$ atoms/cm3 to $9 \times 10^{17}$ atoms/cm3, and the concentration of the second conductive GaP layer 162 may be about 10% to about 30% based on the Mg doping concentration of the second conductive GaP layer 164, but the embodiment is not limited thereto.

If the first concentration exceeds 30% based on the second concentration, the function of Mg trap may not be difficult. If the first concentration is less than 10% based on the second concentration, the hole injection may be failed.

In addition, according to the embodiment, the thickness of the second conductive GaP layer 162 having the first concentration may be in the range of about 1% to about 10% based on the thickness of the second conductive GaP layer 164 having the second concentration.

For example, the thickness of the second conductive GaP layer 164 having the second concentration may be in the range of about 3 μm to 4.5 μm, and may be in the range of about 1% to 10% based on the thickness of the second conductive semiconductor layer 162 having the first concentration.

If the thickness of the second conductive semiconductor layer 162 having the first concentration exceeds 10% based on the thickness of the second conductive semiconductor layer 164 having the second concentration, the second conductive semiconductor layer 162 having the first concentration may serve as a hole injection barrier. If the thickness of the second conductive semiconductor layer 162 having the first concentration is less than 1% based on the thickness of the second conductive semiconductor layer 164 having the second concentration, a function of preventing the Mg diffusion may not be difficult.

According to the embodiment, the second conductive GaP layer 162 having the first concentration and the second conductive GaP layer 164 having the second concentration higher than the first concentration are provided on the second conductive clad layer 150, so that the second conductive GaP layer 162 having the first concentration prevents Mg diffusion. Accordingly, a light emitting device capable of preventing the Po drop when the reliability evaluation of the AlGaInP-based LED is performed, a method of fabricating the light emitting device, a light emitting device package, and a lighting system can be provided.

Thereafter, when a light emitting device chip is formed in a lateral-type structure, the second conductive GaP layer 164 having the second concentration, the second conductive GaP layer 162 having the first concentration, the undoped AlInP-based layer 152, the second conductive clad layer 150, the AlGaInP-based active layer 140, and the first conductive semiconductor layer 130, which are provided on the substrate 110, are sequentially etched to form a mesa structure, and first and second electrodes 171 and 172 may be formed on the second conductive semiconductor layer 130 and the second conductive GaP layer 164 having the second concentration, which are exposed to the outside, respectively. In addition, a portion of the reflective layer 120 may be removed to expose the substrate 110, so that the first electrode 171 may be formed on the substrate 110. In this case, the substrate 110 may include a conductive substrate such as a GaAs substrate, but the embodiment is not limited thereto.

Figure 10:
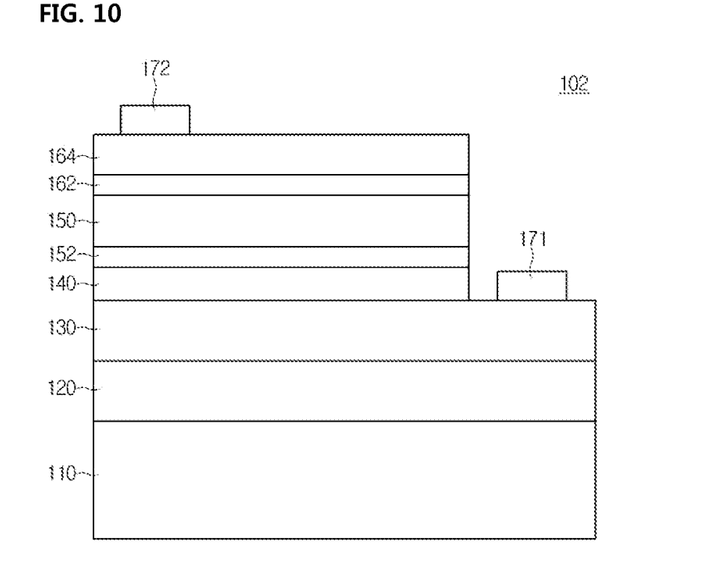

Meanwhile, differently from the structure shown in FIG. 10, when the light emitting device is formed in a vertical-type chip structure, the first electrode 171 may be formed under the substrate 110, and the second electrode 172 may be formed on the second conductive GaP layer 164 having the second concentration.

The embodiment can provide the light emitting device capable of improving the reliability thereof by preventing the Po of the AlGaInP-based LED from being reduced, the method of fabricating the light emitting device, the light emitting device package, and the lighting system.

Figure 11:
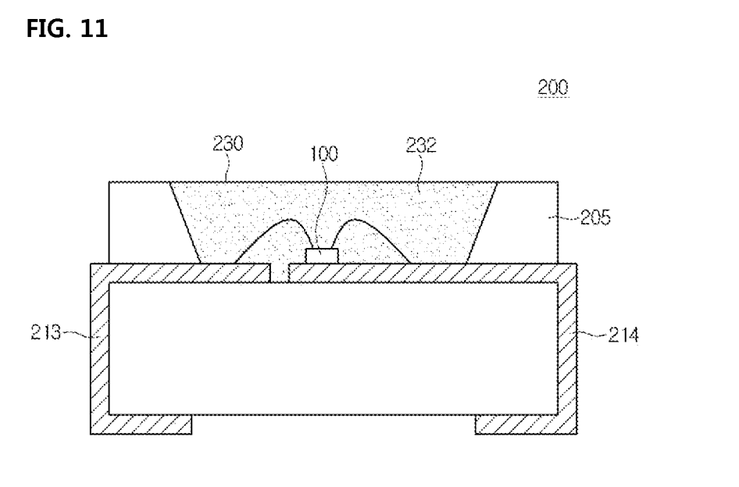
FIG. 11 is a sectional view illustrating a light emitting device package according to the embodiment.

FIG. 11 is a sectional view illustrating a light emitting device package 200 according to the embodiment.

The light emitting device package 200 according to the embodiment includes a package body 205, third and fourth electrode layers 213 and 214 formed on the package body 205, the light emitting device 100 provided on the package body 205 and electrically connected to the third and fourth electrode layers 213 and 214, and a molding member 240 that surrounds the light emitting device 100.

The package body 205 may include silicon, synthetic resin or metallic material. An inclined surface may be formed around the light emitting device 100.

The third and fourth electrode layers 213 and 214 may be electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The lateral type light emitting device shown in FIG. 1 can be employed as the light emitting device 100, but the embodiment is not limited thereto.

The light emitting device 100 may be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire and electrically connected to the fourth electrode layer 214 through the die bonding scheme, but the embodiment is not limited thereto.

The molding member 230 surrounds the light emitting device 100 to protect the light emitting device 100. In addition, the molding member 230 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 12:
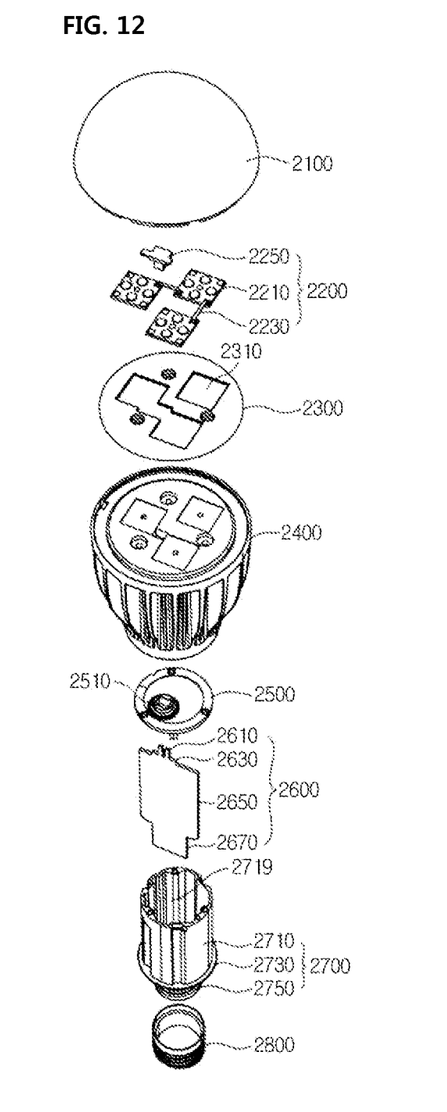
FIG. 12 is an exploded perspective view an example of a lighting system including the light emitting device according to the embodiment.

FIG. 12 is an exploded perspective view an example of a lighting system including the light emitting device according to the embodiment.

As shown in FIG. 12, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the light emitting device, the method of manufacturing the same, the light emitting package, and the lighting system of the embodiment, the light extraction efficiency can be increased.

In addition, according to the embodiment, the optical efficiency can be increased.

The embodiment provides a light emitting device capable of improving the reliability thereof by preventing Po of an AlGaInP-based LED from being reduced, a method of fabricating the light emitting device, a light emitting device package, and a lighting system.

According to the embodiment, there is provided a light emitting device including a first conductive semiconductor layer, an AlGaInP-based active layer on the first conductive semiconductor layer, a second conductive clad layer on the AlGaInP-based active layer, a second conductive GaP layer having first concentration on the second conductive clad layer, and a second conductive GaP layer having second concentration higher than the first concentration on the second conductive GaP layer having the first concentration.

In addition, the light emitting system according to the embodiment may include a light emitting unit having the light emitting device.

As described above, the embodiment can provide the light emitting device capable of improving the reliability thereof by preventing the Po of the AlGaInP-based LED from being reduced, the method of fabricating the light emitting device, the light emitting device package, and the lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   an AlGaInP-based active layer on the first conductive semiconductor layer;
   a second conductive clad layer on the AlGaInP-based active layer;
   a second conductive GaP layer having first concentration on the second conductive clad layer; and
   a second conductive GaP layer having second concentration higher than the first concentration on the second conductive GaP layer having the first concentration.

2. The light emitting device of claim 1, wherein the first concentration of the second conductive GaP layer is in a range of 10% to 30% based on the second concentration of the second conductive GaP layer.

3. The light emitting device of claim 2, wherein the second conductive GaP layer having the second concentration has Mg doping concentration in a range of $1 \times 10^{17}$ atoms/cm$^3$ to $9 \times 10^{17}$ atoms/cm$^3$.

4. The light emitting device of claim 1, wherein the second conductive GaP layer having the first concentration traps magnesium (Mg) therein to prevent Mg diffusion, such that an Mg free region is formed.

5. The light emitting device of claim 1, wherein the second conductive GaP layer having the first concentration has a thickness thinner than a thickness of the second conductive GaP layer having the second concentration.

6. The light emitting device of claim 5, wherein the thickness of the second conductive GaP layer having the first concentration is in a range of 1% to 10% based on the thickness of the second conductive GaP layer having the second concentration.

7. The light emitting device of claim 6, wherein the thickness of the second conductive GaP layer having the second concentration is in a range of 3 μm to 4.5 μm.

8. The light emitting device of claim 1, further comprising an undoped AlInP-based layer between the AlGaInP-based active layer and the second conductive clad layer.

9. The light emitting device of claim 8, wherein the undoped AlInP-based layer prevents Mg diffusion.

10. The light emitting device of claim 8, wherein the undoped AlInP-based layer has an energy level substantially equal to an energy level of the second conductive clad layer.

11. The light emitting device of claim 8, wherein the undoped AlInP-based layer is thinner than the second conductive clad layer.

12. The light emitting device of claim 8, wherein the undoped AlInP-based layer is thinner than the second conductive GaP layer having the first concentration.

13. The light emitting device of claim 1, further comprising a reflective layer on a bottom surface of the first conductive semiconductor layer.

14. The light emitting device of claim 13, wherein the reflective layer comprises distributed bragg-reflectors (DBRs) having a mirror structure, and the distributed brgg-reflectors are formed by depositing an AlAs/AlGaAs layer or an AlGaInP/AlInP layer several times at a thickness of a quarter-wavelength.

15. The light emitting device of claim 14, wherein the first conductive semiconductor layer, the AlGaInP-based active layer, the second conductive clad layer, and the second conductive GaP layer having the first concentration, and the second conductive GaP layer having the second concentration comprise a same material composition or similar material compositions.

16. The light emitting device of claim 15, wherein the reflective layer is formed by depositing the distributed bragg-reflectors (DBRs) to have a lattice structure layer equal to a lattice structure layer of the first conductive semiconductor layer, the AlGaInP-based active layer, and the second conductive clad layer.

17. A lighting system comprising a lighting unit including the light emitting device according to claim 1.

* * * * *